United States Patent
Chen et al.

(10) Patent No.: US 9,698,325 B2
(45) Date of Patent: Jul. 4, 2017

(54) LIGHT-EMITTING DEVICE INCLUDING REFLECTIVE LAYER

(71) Applicant: EPISTAR CORPORATION, Hsinchu (TW)

(72) Inventors: Ding-Yuan Chen, Taichung (TW); Chia-Lin Yu, Sigang Township (TW); Chen-Hua Yu, Hsinchu (TW); Wen-Chih Chiou, Zhunan Township (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/927,131

(22) Filed: Oct. 29, 2015

(65) Prior Publication Data

US 2016/0064632 A1 Mar. 3, 2016

Related U.S. Application Data

(60) Continuation of application No. 14/267,964, filed on May 2, 2014, now Pat. No. 9,214,613, which is a division of application No. 12/270,309, filed on Nov. 13, 2008, now Pat. No. 8,716,723.

(60) Provisional application No. 61/089,755, filed on Aug. 18, 2008.

(51) Int. Cl.
| | |
|---|---|
| *H01L 29/18* | (2006.01) |
| *H01L 33/60* | (2010.01) |
| *H01L 33/08* | (2010.01) |
| *H01L 33/30* | (2010.01) |
| *H01L 33/32* | (2010.01) |
| *H01L 27/15* | (2006.01) |

(52) U.S. Cl.
CPC ............ *H01L 33/60* (2013.01); *H01L 27/15* (2013.01); *H01L 33/08* (2013.01); *H01L 33/30* (2013.01); *H01L 33/32* (2013.01); *H01L 27/156* (2013.01)

(58) Field of Classification Search
CPC .............................. H01L 33/60; H01L 27/15
USPC ............................................................ 257/88
See application file for complete search history.

(56) References Cited

U.S. PATENT DOCUMENTS

| | | | | |
|---|---|---|---|---|
| 4,317,086 A | * | 2/1982 | Scifres | H01L 33/44 257/40 |
| 4,984,034 A | * | 1/1991 | Yamazaki | H01L 27/156 257/65 |
| 5,803,579 A | * | 9/1998 | Turnbull | B60L 1/14 257/E25.02 |

(Continued)

FOREIGN PATENT DOCUMENTS

DE 102 20 333 A1 11/2003

OTHER PUBLICATIONS

Chinese Office Action, Aug. 9, 2010 (5 pages).

*Primary Examiner* — Caleb Henry
(74) *Attorney, Agent, or Firm* — Muncy, Geissler, Olds & Lowe, P.C.

(57) ABSTRACT

A light-emitting device comprises a substrate; a plurality of light-emitting diodes formed on the substrate, wherein each of the plurality of light-emitting diodes comprises a first conductivity type layer, an active layer on the first conductivity type layer, and a second conductivity type layer on the active layer; a reflective layer surrounding a sidewall of each of the plurality of light-emitting diodes; and a top electrode formed on the reflective layer and the plurality of light-emitting diodes.

21 Claims, 5 Drawing Sheets

(56) References Cited

U.S. PATENT DOCUMENTS

| | | | |
|---|---|---|---|
| 5,841,128 A * | 11/1998 | Shibuya | H01L 25/167 250/208.1 |
| 5,930,279 A * | 7/1999 | Apollonov | H01S 5/02236 257/88 |
| 6,410,940 B1 | 6/2002 | Jiang et al. | |
| 6,635,901 B2 * | 10/2003 | Sawaki | H01L 33/20 257/103 |
| 7,135,711 B2 * | 11/2006 | Linder | H01L 27/156 257/103 |
| 7,719,013 B2 * | 5/2010 | Lee | H01L 25/0753 257/100 |
| 7,834,370 B2 * | 11/2010 | Koya | H01L 33/60 257/98 |
| 8,022,419 B2 * | 9/2011 | Yasuda | H01L 33/08 257/88 |
| 8,058,082 B2 * | 11/2011 | Yu | H01L 33/007 438/22 |
| 8,058,663 B2 * | 11/2011 | Fan | H01L 27/15 257/103 |
| 8,272,757 B1 * | 9/2012 | Fan | H01L 25/0753 257/778 |
| 9,214,613 B2 * | 12/2015 | Chen | H01L 27/15 |
| 2003/0087467 A1 * | 5/2003 | Oohata | H01L 33/22 438/47 |
| 2004/0213017 A1 * | 10/2004 | Chou | G02B 6/0041 362/558 |
| 2004/0238834 A1 * | 12/2004 | Yasuoka | H05K 1/0274 257/88 |
| 2005/0023550 A1 * | 2/2005 | Eliashevich | H01L 25/0753 257/99 |
| 2005/0179044 A1 * | 8/2005 | Oohata | H01L 25/0753 257/91 |
| 2005/1019459 | 9/2005 | Kim et al. | |
| 2005/0254243 A1 * | 11/2005 | Jiang | H05B 33/0821 362/231 |
| 2006/0091408 A1 | 5/2006 | Kim et al. | |
| 2006/0102912 A1 * | 5/2006 | Abe | H01L 27/3211 257/88 |
| 2006/0175621 A1 * | 8/2006 | Ohtsuka | H01L 27/156 257/88 |
| 2006/0180818 A1 * | 8/2006 | Nagai | F21K 9/00 257/89 |
| 2006/0214173 A1 * | 9/2006 | Beeson | H01L 33/20 257/88 |
| 2007/0176188 A1 * | 8/2007 | Tanaka | H01L 33/46 257/88 |
| 2007/0190676 A1 * | 8/2007 | Chu | H01L 33/22 438/22 |
| 2007/0215878 A1 * | 9/2007 | Wuu | H01L 33/08 257/72 |
| 2007/0262323 A1 * | 11/2007 | Sonobe | H01L 27/156 257/77 |
| 2007/0278502 A1 * | 12/2007 | Shakuda | C09K 11/584 257/88 |
| 2008/0142814 A1 * | 6/2008 | Chu | H01L 33/22 257/79 |
| 2008/0145961 A1 * | 6/2008 | Horio | H01L 33/08 438/29 |
| 2008/0149945 A1 * | 6/2008 | Nagai | F21K 9/00 257/88 |
| 2008/0149946 A1 * | 6/2008 | Kim | H01L 33/007 257/89 |
| 2008/0237622 A1 * | 10/2008 | Choi | H01L 33/382 257/98 |
| 2008/0251796 A1 * | 10/2008 | Lee | H01L 27/153 257/88 |
| 2008/0251808 A1 * | 10/2008 | Kususe | H01L 24/06 257/98 |
| 2008/0258156 A1 * | 10/2008 | Hata | H01L 33/20 257/88 |
| 2009/0085048 A1 * | 4/2009 | Lee | H01L 27/156 257/89 |
| 2009/9008504 | 4/2009 | Lee et al. | |
| 2009/0121241 A1 * | 5/2009 | Keller | H01L 33/385 257/96 |
| 2009/0212318 A1 * | 8/2009 | Fudeta | H01L 33/32 257/99 |
| 2009/0242910 A1 * | 10/2009 | Murofushi | H01L 27/15 257/88 |
| 2009/0267085 A1 * | 10/2009 | Lee | F21K 9/00 257/88 |
| 2010/0032696 A1 * | 2/2010 | Yu | H01L 33/007 257/96 |
| 2011/0140135 A1 * | 6/2011 | Lee | F21K 9/00 257/88 |
| 2011/0284903 A1 * | 11/2011 | Loh | H01L 33/486 257/98 |

\* cited by examiner

LIGHT-EMITTING DEVICE INCLUDING REFLECTIVE LAYER

PRIORITY DATA

The present application is a continuation application of U.S. patent application Ser. No. 14/267,964, filed on May 2, 2014, now pending, which is a divisional application of U.S. patent application Ser. No. 12/270,309, filed on Nov. 13, 2008, now U.S. Pat. No. 8,716,723 issued May 6, 2014, which claims the benefit of U.S. Provisional Patent Application No. 61/089,755, filed on Aug. 18, 2008, both entitled "Reflective Layer for Light-Emitting Diodes," incorporated herein by reference in their respective entireties.

TECHNICAL FIELD

The present invention relates generally to a system and method for manufacturing light-emitting diodes (LEDs), and more particularly, to a system and method for manufacturing LEDs with a reflective layer.

BACKGROUND

Generally, light-emitting diodes (LEDs) are formed using a diode with a first contact layer, an active layer, and a second contact layer on a substrate. When these layers are forward biased, light at various wavelengths can be generated, which then propagates outward in multiple directions. Some of these directions may be undesired, such as when the light is intended to propagate in a particular direction, or the light impacts a light-absorbing material (such as a silicon substrate), which decreases the overall luminosity of the LED.

These problems of luminosity and directionality have been treated by such methods as placing a distributed Bragg reflector (DBR) beneath the active layer of the LED to reflect the light away from the substrate. However, DBRs become less efficient reflectors at higher incident angles relative to normal to the surface of the DBRs. Additionally, some light may not even impact a DBR as the light escapes the LEDs and propagates toward the substrate, which may absorb the light and prevent its reflection.

Another solution has been to use a light transmissive substrate such as sapphire and form a reflective layer on an opposite side of the substrate from the LEDs. However, this procedure limits the materials available for LED substrates to light transmissive substrates such as sapphire, and prevents the usage of more preferred substrates such as silicon. This can lead to more complicated and expensive manufacturing processes.

Accordingly, what is needed is a structure that allows for the use of more materials for substrates without a corresponding absorption of light.

SUMMARY OF THE INVENTION

These and other problems are generally solved or circumvented, and technical advantages are generally achieved, by preferred embodiments of the present invention which provide a reflective surface between LEDs.

In accordance with a preferred embodiment of the present invention, a light-emitting device comprises a substrate, a first LED with a first active layer on the substrate, and a second light-emitting diode with a second active layer on the substrate. A reflective layer is located on the substrate between the first light-emitting diode and the second light-emitting diode, and the reflective layer comprises a top surface that is closer to the substrate than the first active layer.

In accordance with another preferred embodiment of the present invention, a light-generating device comprises a substrate and a reflective layer over portions of the substrate, the reflective layer having a first thickness. A plurality of light-emitting diodes extends through the reflective layer to the substrate, each of the plurality of light-emitting diodes comprising an active layer that is located a first distance from the substrate, the first distance being greater than the first thickness.

In accordance with yet another preferred embodiment of the present invention, a method for forming a light-generating device comprises providing a substrate and forming a plurality of light-emitting diodes on the substrate, each of the light-emitting diodes comprising an active layer. A reflective layer is formed on the substrate between the plurality of light-emitting diodes and below the active layer.

A light-emitting device comprises a substrate; a plurality of light-emitting diodes formed on the substrate, wherein each of the plurality of light-emitting diodes comprises a first conductivity type layer, an active layer on the first conductivity type layer, and a second conductivity type layer on the active layer; a reflective layer surrounding a sidewall of each of the plurality of light-emitting diodes; and a top electrode formed on the reflective layer and the plurality of light-emitting diodes.

An advantage of a preferred embodiment of the present invention is the enhancement of the light output of the devices incorporating the reflector. Preferred embodiments also allow for the use of light-absorbing materials as a substrate for the LEDs.

BRIEF DESCRIPTION OF THE DRAWINGS

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a reflective layer for multiple LEDs. The invention may also be applied, however, to other reflective layers.

Figure 1:
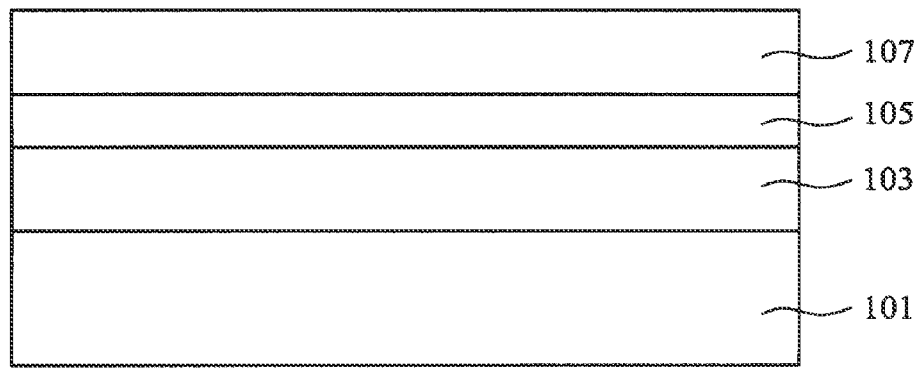
FIG. 1 illustrates the formation of a first contact layer, an active layer, and a second contact layer over a substrate in accordance with an embodiment of the present invention.

With reference now to FIG. 1, there is shown a substrate 101, a first contact layer 103, an active layer 105, and a second contact layer 107. The substrate 101 is preferably a sapphire or semiconductor substrate. It should be noted that while embodiments of the present invention are described in the context of using a bulk silicon substrate, other substrates may be used. For example, silicon-on-insulator (SOI) substrates, SiC substrates, $MgAl_2O_4$ substrates, and the like may also be used. Embodiments of the present invention, however, may be particularly suited to silicon substrates due to the low cost in addition to reducing the residual stress in the LED structure formed thereon. Furthermore, while a substrate having a (111) surface orientation is preferred, substrates having a different surface orientation, such as (100) and (110) surface orientations, may also be used. Silicon substrates may also improve the extraction efficiency and allow a selective group III-N epitaxial growth process to be used.

The first contact layer 103 is preferably formed over the substrate 101. The first contact layer 103 preferably forms one part of the diode required to emit light, and preferably comprises a group III-V compound. As the name implies, group III-V compounds comprise a group III element and a group V element and include compounds such as GaN, InN, AlN, $Al_xGa_{(1-x)}N$, $Al_xIn_{(1-x)}N$, $Al_xIn_yGa_{(1-x-y)}N$, combinations thereof, or the like. In an embodiment in which p-up LEDs are being formed, the first contact layer 103 is preferably doped with a dopant of an n-type conductivity type (e.g., n-GaN). However, p-type dopants may alternatively be used, depending upon the desired conductivity of the first contact layer 103 to form an n-up LED.

The first contact layer 103 is preferably formed, for example, through an epitaxial growth process such as molecular beam epitaxy (MBE), although other processes, such as hydride vapor phase epitaxy (HVPE), liquid phase epitaxy (LPE), or the like, may alternatively be utilized. The first contact layer 103 is preferably formed to have a thickness of between about 1 μm and about 6 μm, with a preferred thickness of about 2 μm. The first contact layer 103 is preferably doped in situ during formation to a concentration of between about $1 \times 10^{16}$ cm$^{-3}$ and about $1 \times 10^{19}$ cm$^{-3}$, with a preferred dopant concentration of about $1 \times 10^{18}$ cm$^{-3}$, although other processes, such as ion implantation or diffusion may alternatively be utilized.

The active layer 105 is preferably formed over the first contact layer 103. The active layer 105 is designed, among other things, to control the generation of light to desired wavelengths. For example, by adjusting and controlling the proportional composition of the elements in the active layer 105, the bandgap of the materials in the active layer 105 may be adjusted, thereby adjusting the wavelength of light that will be emitted by the LED.

The active layer 105 preferably comprises multiple quantum wells (MQW). MQW structures in the active layer 105 may comprise, for example, layers of InGaN, GaN, $Al_xIn_yGa_{(1-x-y)}N$ (where 0≤x≤1), or the like. The active layer 105 may comprise any number of quantum wells, 5 to 20 quantum wells for example, each preferably about 30 to about 100 Å thick. The MQWs are preferably epitaxially grown using the first contact layer 103 as a nucleation layer using metal organic chemical vapor deposition (MOCVD), although other processes, such as MBE, HYPE, LPE, or the like, may alternatively be utilized.

The second contact layer 107 is preferably formed over the active layer 105. The second contact layer 107 preferably forms the second part of the diode required to emit light in conjunction with the first contact layer 103. The second contact layer 107 preferably comprises a group III-V compound such as GaN, InN, AlN, $Al_xGa_{(1-x)}N$, $Al_xIn_{(1-x)}N$, $Al_xIn_yGa_{(1-x-y)}N$, combinations thereof, or the like, doped with a dopant of a second conductivity type (e.g., p-GaN) opposite the first conductivity type in the first contact layer 103.

The second contact layer 107 is preferably formed, for example, through an epitaxial growth process such as MOCVD. Other processes, however, such as HYPE, LPE, MBE, or the like, may alternatively be utilized. The second contact layer 107 is preferably formed to have a thickness of between about 0.1 μm and about 2 μm, with a preferred thickness of about 0.3 μm and is preferably doped in situ to a concentration of between about $1 \times 10^{17}$ cm$^{-3}$ and about $1 \times 10^{21}$ cm$^{-3}$, with a preferred dopant concentration of about $1 \times 10^{19}$ cm$^3$, although other processes, such as ion implantation or diffusion, may alternatively be utilized.

Figure 2:
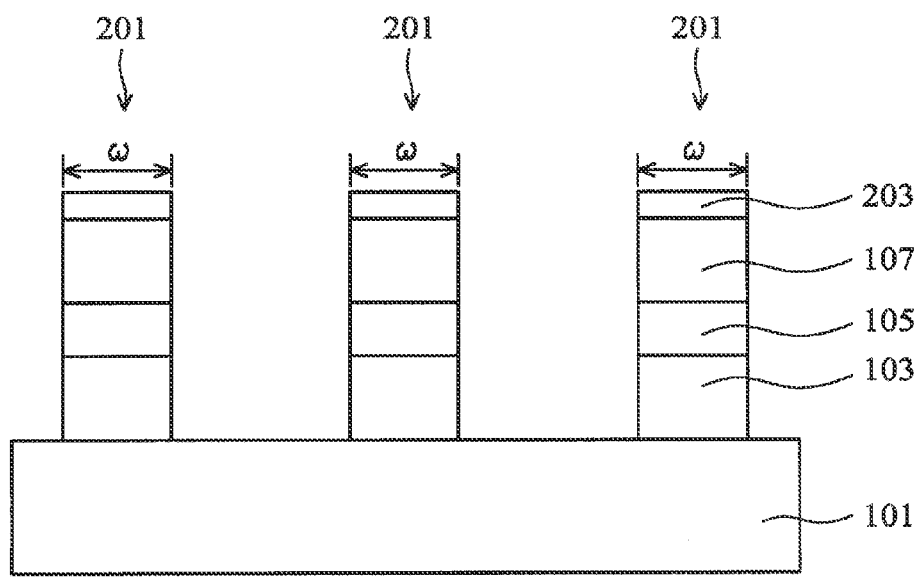
FIG. 2 illustrates the patterning of the first contact layer, the active layer, and the second contact layer into individual LEDs in accordance with an embodiment of the present invention.

FIG. 2 illustrates the patterning of the first contact layer 103, the active layer 105, and the second contact layer 107 to form a plurality of LEDs 201. These LEDs 201 are preferably micro and nano-sized LEDs 201 that have a width co comparable with the wavelength of the light that will be emitted. For example, while the LEDs 201 preferably have a width of between about 10 nm and about 10 μm, with a preferred width of about 250 nm, the LEDs 201 even more preferably have a width of between about 0.3 to about 3 times the wavelength of the light that will be emitted from the LEDs 201, such as 250 nm for light with a wavelength of 480 nm. In this embodiment in which the width of the nano-sized LEDs 201 is comparable to the wavelength of the emitted light, the downward-propagating light will not be substantially confined within the nano-sized LEDs 201, thereby leading to even more light being emitted from the LEDs 201.

The first contact layer 103, the active layer 105, and the second contact layer 107 are preferably patterned by forming a hard mask 203 from a material such as silicon nitride, silicon oxide, a metal such as nickel, combinations of these, or the like over the second contact layer 107. The hard mask 203 is preferably formed by blanket depositing a hard mask layer (not shown) over the second contact layer 107. A suitable photolithographic process is then preferably used to pattern the hard mask layer into the hard mask 203 and to expose those portions of the second contact layer 107 that are desired to be removed to form the LEDs 201 as illustrated in FIG. 2. Other processes, however, such as a photolithographic mask or nanoimprint, may alternatively be used to protect and pattern the first contact layer 103, the active layer 105, and the second contact layer 107.

Once the hard mask 203 has been formed and patterned, an etching process is preferably performed to form the pillars of the LEDs 201. An etching process such as a dry etch may be used to remove those portions of the second contact layer 107, the active layer 105, and the first contact layer 103 that have been left exposed by the hard mask 203. Preferably, this etching is performed to remove the first contact layer 103, the active layer 105, and the second contact layer 107 in a single etching step, although multiple etching processes may alternatively be used to form the LEDs 201.

Figure 3:
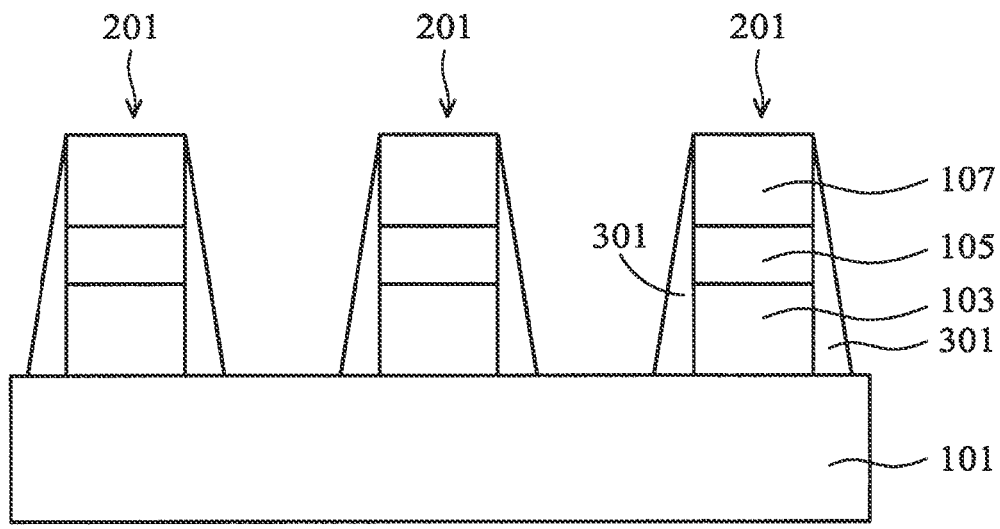
FIG. 3 illustrates the formation of spacers along the sidewalls of the LEDs in accordance with an embodiment of the present invention.

FIG. 3 illustrates the formation of spacers 301 and the removal of the hard mask 203. The spacers 301 preferably prevent the first contact layer 103 from electrically shorting to the second contact layer 107 and are typically formed by initially blanket depositing a spacer layer (not shown) on the previously formed structure. The spacer layer preferably comprises a material such as Sin, ox nitride, SiC, SiON, oxide, and the like. The spacer layer is preferably formed by commonly used methods such as chemical vapor deposition (CVD), plasma enhanced CVD, sputter, and other methods known in the art and is then patterned to form the spacers 301, preferably by anisotropically etching to remove the spacer layer from the horizontal surfaces of the LEDs 201 and the substrate 101.

Once the spacers 301 have been formed, the hard mask 203 is preferably removed from the upper surfaces of the second contact layer 107. Preferably, the hard mask 203 is removed using a wet etch that is selective to the material of the hard mask (e.g., silicon nitride or nickel) while not substantially removing material from the LEDs 201 or the substrate 101. Alternatively, a grinding process such as CMP, or a combination of etching and grinding, may alternatively be used to remove the hard mask 203.

Figure 4:
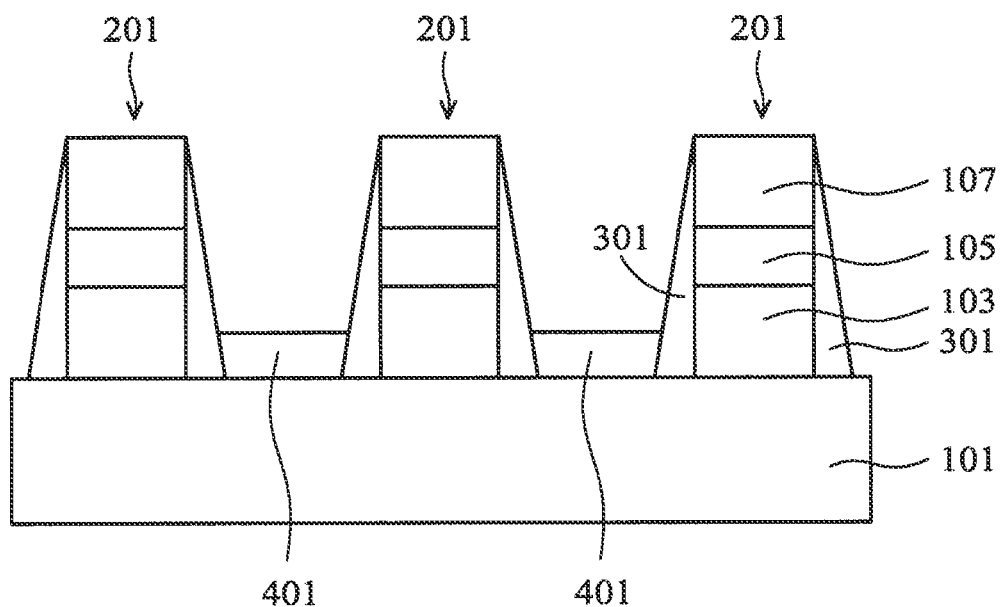
FIG. 4 illustrates the formation of a reflective thin film along the substrate between the LEDs in accordance with an embodiment of the present invention.

FIG. 4 illustrates the formation of a reflective layer 401 along the substrate 101 between the individual LEDs 201 and below the level of the active layer 105. The reflective layer 401 preferably comprises a high-reflective metal such as aluminum, silver, or the like, although any suitably reflective material may alternatively be used. The reflective layer 401 is preferably formed by initially forming a blanket layer of high-reflective metal through a process such as physical vapor deposition (PVD), although other processes, such as CVD or sputtering, may alternatively be used, and then etching undesired portions of the blanket layer using a suitable photolithographic process to form the reflective layer 401. The reflective layer 401 is preferably formed to be at least 10 nm thick, but is also preferably formed to be lower than the active layer 105 of the LEDs 201, so preferably has a thickness no greater than the distance between the substrate 101 and the lower portion of the active layer 105.

By preferably forming the reflective layer 401 along the substrate 101 between the individual LEDs 201 and below the active layer 105, any light that escapes from the individual LEDs 201 that is propagating toward the substrate 101 may be reflected prior to impinging upon the substrate 101. If the substrate 101 is a light absorbing substrate 101, such as silicon, the reflective layer 401 will increase the overall luminosity of the LEDs 201 as the light will be reflected instead of being absorbed. Additionally, the reflective layer 401 may be used to direct light in a certain direction (e.g., away from the substrate 101), and away from undesired directions.

Figure 5A:
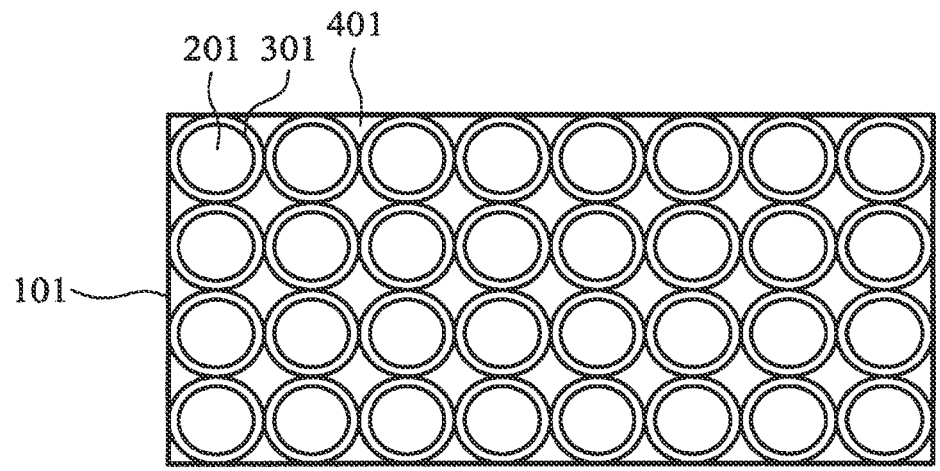
FIGS. 5A-5E illustrate plan views of various shapes of the individual LEDs in accordance with an embodiment of the present invention.

FIGS. 5A-5E illustrate plan views of multiple LEDs 201, their associated spacers 301, and the reflective layer 401. While the shape of the individual LEDs 201 may be any shape, FIG. 5A illustrates a preferred embodiment in which the LEDs 201 are circular. In this embodiment the circular LEDs 201 preferably have a diameter of between about 10 nm and about 5,000 nm, with a preferred diameter of about 250 nm. The individual LEDs 201 are also preferably arranged in a grid pattern, with a pitch of between about 10 nm and about 10 m, with a preferred pitch of about 250 nm, although other layouts, such as a staggered layout, may alternatively be used.

Figure 5B:
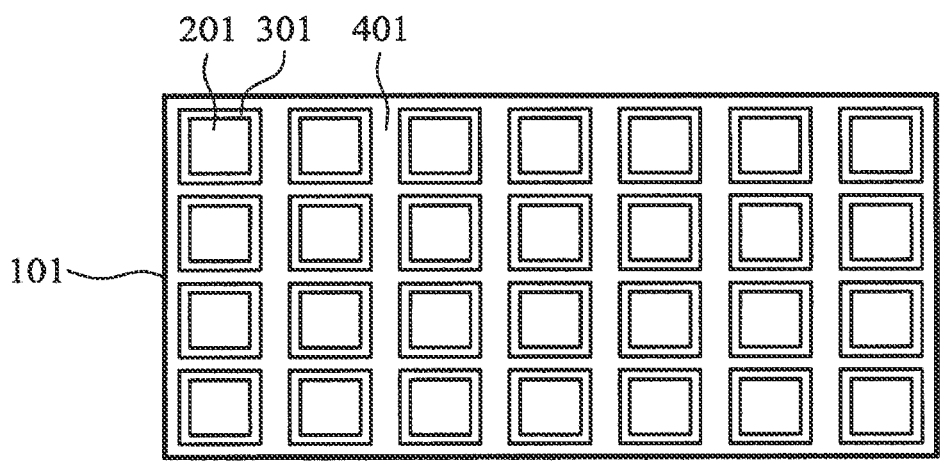

FIG. 5B illustrates another preferred embodiment in which the LEDs 201 are rectangular in shape. In this embodiment, the LEDs 201 are also preferably arranged in a grid pattern with the reflective layer 401 between the individual LEDs 201. The rectangular LEDs 201 also preferably have a length of between about 10 nm and about 5,000 nm, with a preferred length of about 10 μm, a width of between about 10 nm and about 5,000 nm, with a preferred width of about 250 nm, and a spacing between the LEDs 201 of between about 10 nm and about 5,000 nm, with a preferred spacing of about 250 nm.

Figure 5C:
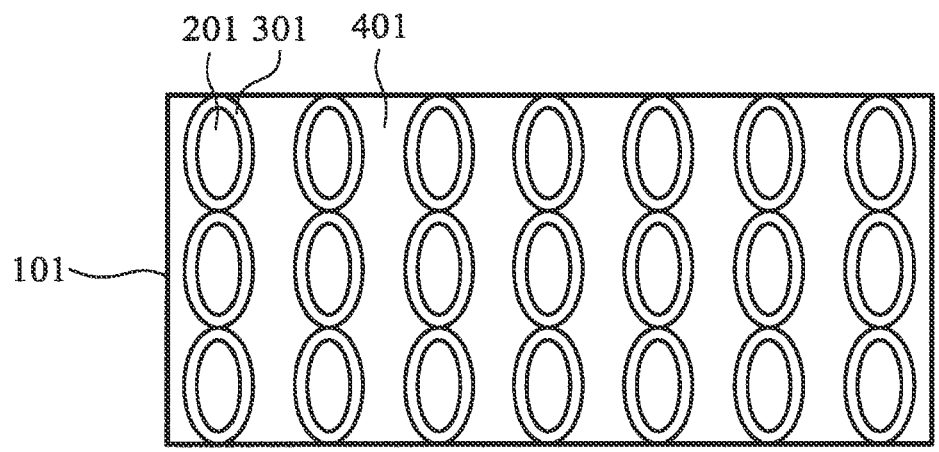

FIG. 5C illustrates yet another preferred embodiment in which the LEDs 201 are elliptical in shape. In this embodiment, the elliptical LEDs 201 are preferably, but not necessarily, arranged in a grid pattern, with a preferred spacing between the LEDs 201 of between about 10 nm and about 10 μm, with a preferred spacing of about 250 nm.

Figure 5D:
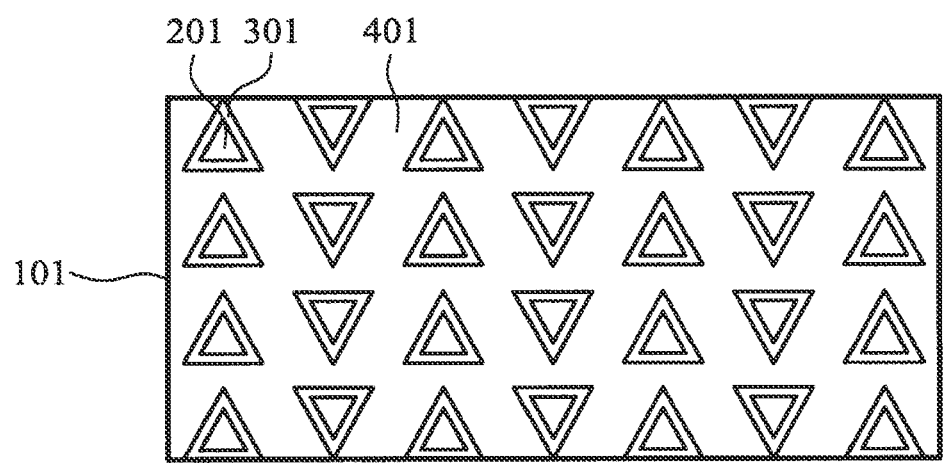

FIG. 5D illustrates yet another preferred embodiment in which the LEDs 201 are triangular in shape. In this embodiment, the triangular LEDs 201 are preferably arranged in rows and columns, although the LEDs 201 could alternatively be staggered. The LEDs 201 in this embodiment preferably have a pitch of between about 10 nm and about 10 μm, with a preferred pitch of about 250 nm, and the triangular LEDs 201 preferably have a side length of between about 10 nm and about 5,000 nm, with a preferred side length of about 250 nm.

Figure 5E:
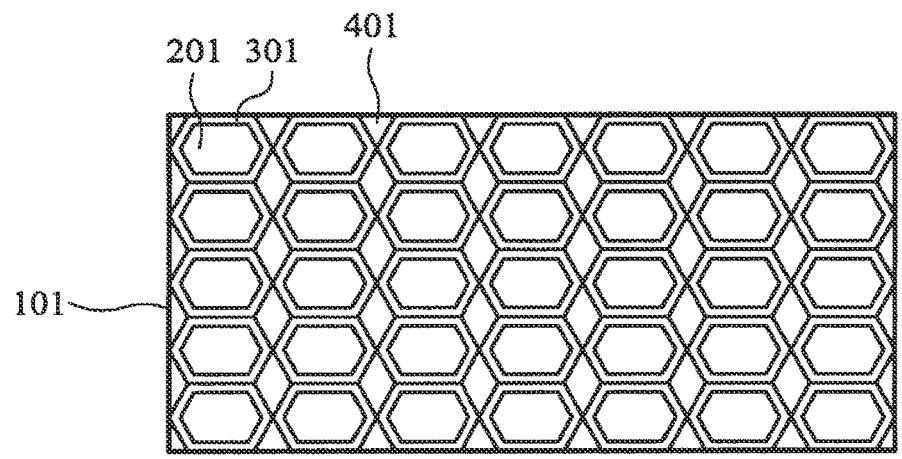

FIG. 5E illustrates yet another preferred embodiment in which the LEDs 201 are hexagonal in shape. In this embodiment, the hexagonal LEDs 201 are preferably arranged in rows and columns, although the LEDs 201 may alternatively be staggered so as not to align with each other. In this embodiment the LEDs 201 preferably have a pitch of between about 10 nm and about 10 μm, with a preferred pitch of about 250 nm.

Figure 6:
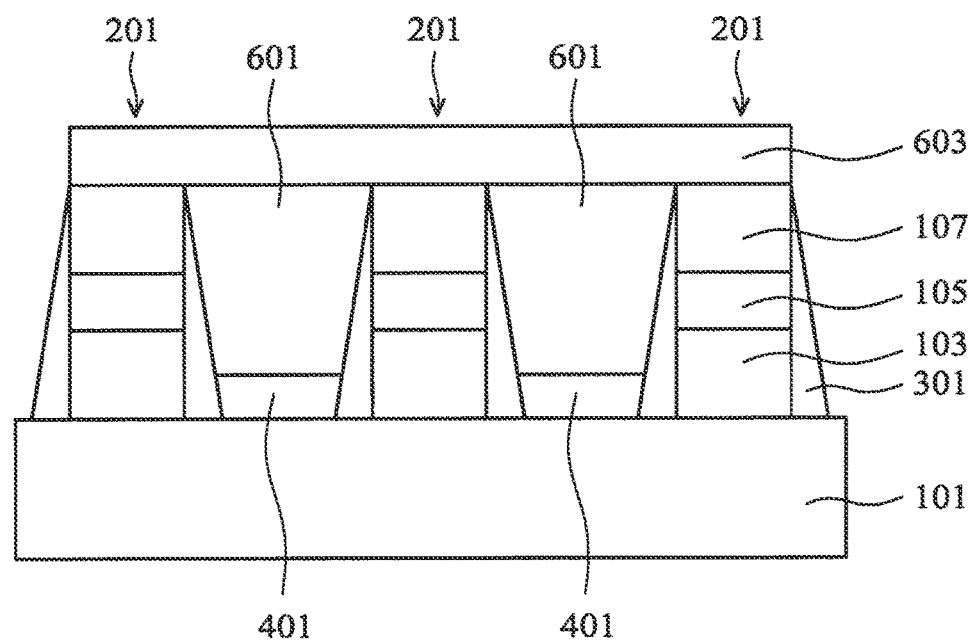
FIG. 6 illustrates the formation of a top electrode over the LEDs in accordance with an embodiment of the present invention.

FIG. 6 illustrates the filling of the area above the reflective layer 401 and between the LEDs 201 with a fill material 601 and the formation of a top electrode 603. The fill material 601 preferably comprises a material that is transparent to LED radiation (e.g., visible light), such as silicon dioxide, and is preferably formed by, for example, chemical vapor deposition (CVD) techniques using tetra-ethyl-ortho-silicate (TEOS) and oxygen as precursors. However, other materials, such as silicon nitride, silicon oxynitride, or the like, and other processes, such as plasma enhanced CVD, may alternatively be used.

Preferably, the fill material 601 is formed so as to overfill the areas between the LEDs 201 and above the reflective layer 401. Excess fill material 601 is then removed through a grinding process, such as chemical mechanical polishing (CMP), so as to expose the second contact layer 107. Other removal processes, however, such as etching or a combination of etching and grinding, may alternatively be used to remove the excess fill material 601.

Once the excess fill material 601 has been removed and the second contact layer 107 has been substantially exposed, a top electrode 603 is formed in electrical contact with the second contact layer 107 of one or more of the LEDs 201. The top electrode 603 is preferably formed of a transparent, conductive material such as a thin layer of nickel, a thin layer of gold, a transparent conductive oxide, combinations of these, or the like, and may be formed through a process such as PVD, sputtering, CVD, or the like. The top electrode 603 preferably has a thickness of between about 10 Å and about 1,000 Å, with a preferred thickness of about 100 Å.

Thereafter, processes may be performed to complete the LEDs 201. For example, electrical contacts may be formed to the first contact layer 103 in each LED 201, either through a conductive substrate 101 or else through the formation of another contact in cases when the substrate is non-conductive. Eventually, the LED device may be diced and packaged.

It should also be noted that the above description describes a method of forming LEDs with a reflective surface between the LEDs. Other layers, such as a distributed Bragg reflector or a buffer layer, may be desirable as part of the individual LEDs 201. Depending upon the type of substrate 101 and the connections to the first and second contact layers 103 and 107, respectively, a buffer layer may also be desirable between the first contact layer 103 and the substrate 101. For example, with some types of substrates, such as SiC and Si substrates, a buffer layer, such as AN or AlGaN, may be desirable to aid in the epitaxial growth of a group III-N compound on the SiC substrate. A distributed Bragg reflector generally comprises multiple layers having different refractive indices that cause light emitted from the LEDs to be reflected, thereby increasing the light emitted from the top of the LEDs 201. A reflective buffer layer may also be used with or in place of the distributed Bragg reflector.

The structure of the LEDs 201 may also vary depending on the type of materials used and the intended application. It is expected that many types of LED structures may be used with embodiments of the present invention, which provides a reflective surface between the LEDs 201.

Although the present invention and its advantages have been described in detail, it should be understood that various changes, substitutions and alterations can be made herein without departing from the spirit and scope of the invention as defined by the appended claims. For example, buffer layers or distributed Bragg reflectors may be used in conjunction with the LEDs. As another example, it will be readily understood by those skilled in the art that various materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light-emitting device, comprising:
a substrate;
a first light-emitting diode formed on the substrate;
a second light-emitting diode formed on the substrate and separated from the first light-emitting diode by a space, wherein the space is a surface of the substrate;
a spacer layer formed on the space and surrounding multiple sidewalls of the first light-emitting diode and the second light-emitting diode;
a reflective layer formed on the spacer layer and surrounding the multiple sidewalls of the first light-emitting diode and the second light-emitting diode; and
a top electrode formed on the first light-emitting diode and the second light-emitting diode,
wherein the top electrode comprises transparent conductive material.

2. The light-emitting device according to claim 1, wherein the top electrode is formed on the spacer layer.

3. A light-emitting device according to claim 1, wherein each of the first light-emitting diode and the second light-emitting diode comprises a first conductivity type layer, an active layer on the first conductivity type layer, a second conductivity type layer on the active layer, and the reflective layer comprises a top surface lower than the active layer.

4. A light-emitting device according to claim 1, wherein the spacer layer comprises an inclined sidewall.

5. A light-emitting device according to claim 1, wherein the reflective layer comprises silver (Ag) or aluminum (Al).

6. The light-emitting device according to claim 1, wherein the substrate comprises a sapphire substrate, a semiconductor substrate, a SiC substrate, or a silicon substrate.

7. The light-emitting device according to claim 1, wherein the spacer layer comprises nitride, oxide, or $SiO_xN_y$.

8. The light-emitting device according to claim 1, wherein the reflective layer is separated from the first light-emitting diode and the second light-emitting diode by the spacer layer.

9. The light-emitting device according to claim 1, wherein the reflective layer is formed between the first light-emitting diode and the second light-emitting diode.

10. The light-emitting device according to claim 1, wherein each of the first light-emitting diode and the second light-emitting diode comprises a rectangular shape from a top view of the light-emitting device.

11. The light-emitting device according to claim 1, wherein the first light-emitting diode and the second light-emitting diode are separated from each other with a distance between 10 nm and 5000 nm.

12. A light-emitting device, comprising:
a substrate;
a first light-emitting diode formed on the substrate;
a second light-emitting diode formed on the substrate and separated from the first light-emitting diode by a space, wherein the space is a surface of the substrate;
a spacer layer formed on the space and surrounding multiple sidewalls of the first light-emitting diode and the second light-emitting diode;
a reflective layer formed on the space;
a top electrode formed on the first light-emitting diode and the second light-emitting diode, wherein the top electrode comprises transparent conductive material; and
a fill material formed on the first light-emitting diode and the second light-emitting diode, wherein one or multiple portions of the fill material is removed, and the top electrode is electrically connected to the first light-emitting diode and the second light-emitting diode through the one or multiple portions.

13. The light-emitting device according to claim 12, wherein each of the first light-emitting diode and the second light-emitting diode comprises a first conductivity type layer, an active layer on the first conductivity type layer, a second conductivity type layer on the active layer, and the reflective layer comprises a top surface lower than the active layer.

14. The light-emitting device according to claim 12, wherein the top electrode is formed on the spacer layer.

15. The light-emitting device according to claim 12, wherein the spacer layer comprises an inclined sidewall.

16. The light-emitting device according to claim 12, wherein the reflective layer comprises silver (Ag) or aluminum (Al).

17. The light-emitting device according to claim 12, wherein the substrate comprises a sapphire substrate, a semiconductor substrate, a SiC substrate, or a silicon substrate.

18. The light-emitting device according to claim 12, wherein the spacer layer comprises nitride, oxide, or $SiO_xN_y$.

19. The light-emitting device according to claim 12, wherein the reflective layer is separated from the first light-emitting diode and the second light-emitting diode by the spacer layer.

20. The light-emitting device according to claim 12, wherein each of the first light-emitting diode and the second light-emitting diode comprises a rectangular shape from a top view of the light-emitting device.

21. The light-emitting device according to claim 12, wherein the first light-emitting diode and the second light-emitting diode are separated from each other with a distance between 10 nm and 5000 nm.

* * * * *